United States Patent
Wu (10) Patent No.: US 11,424,700 B2
(45) Date of Patent: Aug. 23, 2022

(54) HALL ELEMENT SENSING CIRCUIT

(71) Applicant: Infineon Technologies Austria AG, Villach (AT)

(72) Inventor: Wei Wu, Rancho Palos Verdes, CA (US)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 63 days.

(21) Appl. No.: 16/112,291

(22) Filed: Aug. 24, 2018

(65) Prior Publication Data

US 2020/0067430 A1 Feb. 27, 2020

(51) Int. Cl.
*H02K 29/08* (2006.01)
*H02P 6/16* (2016.01)
*G01D 5/14* (2006.01)

(52) U.S. Cl.
CPC .............. *H02P 6/16* (2013.01); *G01D 5/142* (2013.01); *H02K 29/08* (2013.01)

(58) Field of Classification Search
CPC combination set(s) only.
See application file for complete search history.

(56) References Cited

U.S. PATENT DOCUMENTS

| | | | |
|---|---|---|---|
| 5,493,187 A | 2/1996 | Iijima | |
| 5,872,442 A * | 2/1999 | Gotou | H02P 6/06 318/400.12 |
| 8,995,241 B1 * | 3/2015 | Heo | G02B 7/023 369/44.14 |
| 9,705,436 B2 | 7/2017 | Fedigan et al. | |
| 2011/0234129 A1 | 9/2011 | Shimizu et al. | |
| 2011/0279072 A1 * | 11/2011 | Shimizu | H02P 6/16 318/400.04 |
| 2012/0262097 A1 | 10/2012 | Yamato et al. | |
| 2013/0080087 A1 | 3/2013 | Donovan et al. | |
| 2016/0341772 A1 * | 11/2016 | Roberts | G01R 35/005 |
| 2017/0093313 A1 * | 3/2017 | Brown | H02P 27/08 |
| 2017/0163182 A1 * | 6/2017 | Fedigan | H02K 29/08 |

(Continued)

FOREIGN PATENT DOCUMENTS

JP 2012061891 A 3/2012
WO 9712299 A1 4/1997

OTHER PUBLICATIONS

"Complete Motion Controller Module for PM AC Fan," NBC9604, NBC9605, NBC9606, PD 09042012, International Rectifier, www.irf.com. El Segundo, California, Apr. 9, 2012, 30 pages.

(Continued)

*Primary Examiner* — Muhammad S Islam
*Assistant Examiner* — Charles S Laughlin
(74) *Attorney, Agent, or Firm* — Slater Matsil, LLP (57) ABSTRACT

A Hall sensor circuit includes a first Hall element and a second Hall element, first and second Analog-to-Digital Converter ("ADC") channel inputs passively coupled to first and second output nodes of the first Hall element, third and fourth ADC channel inputs passively coupled to the first and second output nodes of the second Hall element, a first ADC output for providing a first digital output signal, and a second ADC output for providing a second digital output signal. The Hall element outputs can be directly coupled to the ADC or coupled through a passive resistor-capacitor filter.

12 Claims, 7 Drawing Sheets

(56) References Cited

U.S. PATENT DOCUMENTS

2017/0250634 A1* 8/2017 Ambruson .............. H02P 6/182
2017/0336225 A1* 11/2017 Burdette .................. G01D 5/14

OTHER PUBLICATIONS

Hejny R.W. et al., "Evaluating the practical low speed limits for back-EMF tracking-based sensorless speed control using drive stiffness as a key metric," 2009 IEEE Energy Conversion Congress and Exposition, 2009, pp. 2481-2488, doi: 10.1109/ECCE.2009.5316087.

Hyunbae, Kim et al., "Using low resolution position sensors in bumpless position/speed estimation methods for low cost PMSM drives," Fourtieth IAS Annual Meeting. Conference Record of the 2005 Industry Applications Conference, 2005, pp. 2518-2525 vol. 4, doi: 10.1109/IAS.2005.1518814.

* cited by examiner

HALL ELEMENT SENSING CIRCUIT

TECHNICAL FIELD

The present invention relates generally to a Hall element sensing circuit and method.

BACKGROUND

Three types of Hall sensor products are available in the market for detecting magnetic flux and include buffered Hall sensors with analog outputs; buffered Hall sensors with digital outputs; and unbuffered Hall elements. Buffered Hall sensors with analog outputs typically have a Hall element as well as an integrated circuit ("IC") such as an operational amplifier to amplify the sensed signal from the Hall element and convert it to an amplified analog signal. Buffered Hall sensors with digital outputs typically have a Hall element as well as an IC such as a comparator or an analog-to-digital converter ("ADC"). If a comparator is used, a high or low logic output signal is provided wherein the logic output signal represents the direction of flux traversing through the Hall sensor. If an ADC is used, numerous digital output signals are provided that correspond to the magnitude and direction of the flux traversing through the Hall sensor. An unbuffered Hall element is simply a Hall element that does not have a corresponding signal conditioning IC, but can be provided in a package similar to the buffered Hall sensors.

Figure 1A:
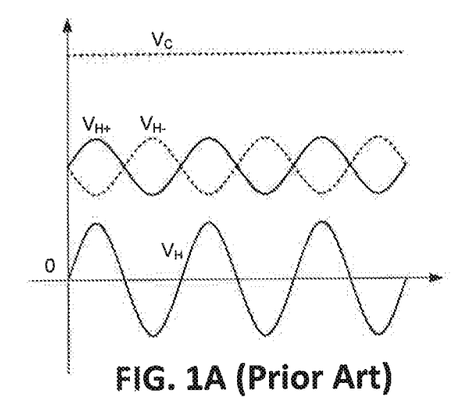
FIG. 1A is a timing diagram for a Hall element according to the prior art.
Figure 1B:
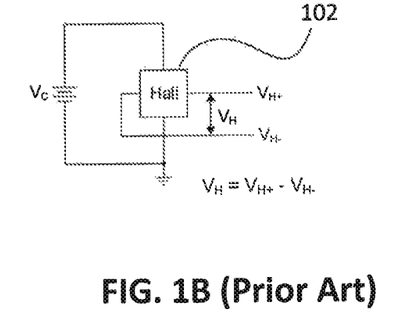
FIG. 1B is a schematic diagram of the Hall element for generating the signals shown in the timing diagram of FIG. 1A according to the prior art.

FIG. 1A is a timing diagram for an unbuffered Hall element according to the prior art and FIG. 1B is a schematic diagram of the Hall element 102 for generating the signals shown in the timing diagram of FIG. 1A according to the prior art. In FIG. 1B, an unbuffered Hall element 102 is coupled between $V_C$ and ground, and generates a differential output signal $V_H = V_{H+} + V_{H-}$, wherein $V_{H+}$ and $V_{H-}$ are the single ended output signals. The ground and $V_C$ voltage levels are shown in FIG. 1A, as well as the $V_H$ signal, which is referenced to ground, and the $V_{H+}$, and $V_{H-}$, signals, which are referenced to $V_C/2$. The output signal of the Hall element is an analog or linear signal that corresponds to the sensed flux.

Figure 2A:
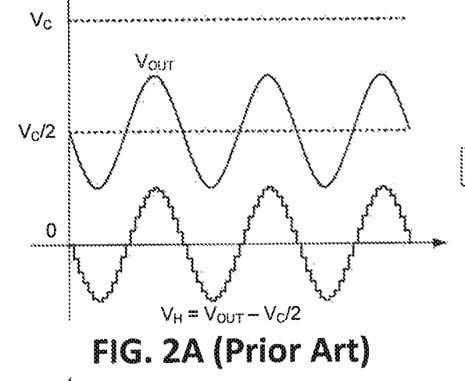
FIG. 2A is a timing diagram for a Hall sensor circuit with analog or digital outputs including additional processing circuitry according to the prior art.
Figure 2B:
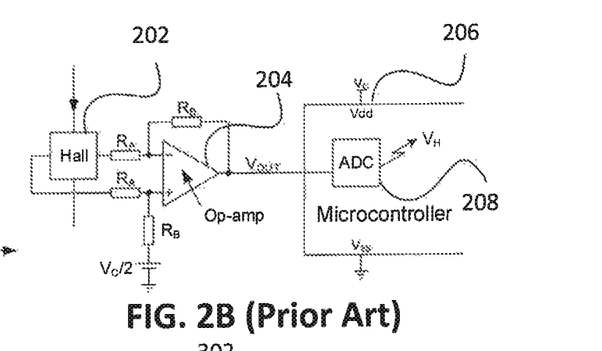
FIG. 2B is a schematic diagram of the sensor circuit for generating the signals shown in the timing diagram of FIG. 1A according to the prior art.

FIG. 2A is a timing diagram for a buffered Hall sensor circuit including additional processing circuitry according to the prior art and FIG. 2B is a schematic diagram of the buffered Hall sensor circuit for generating the signals shown in the timing diagram of FIG. 2A according to the prior art. In FIG. 1B, a Hall element 202 is coupled between $V_C$ and ground, and generates a differential output. The differential output of Hall element 202 is coupled to an operational amplifier circuit including operational amplifier 204 having resistors $R_A$ and $R_B$ as well as a reference voltage $V_C/2$ for generating the $V_{OUT}$ output signal. The ground and $V_C$ voltage levels are shown in FIG. 2A, as well as the $V_{OUT}$ signal, which is referenced to $V_C/2$. If the Hall element 202 and the operational amplifier 204 are coupled together in a package, a buffered Hall sensor with an analog output is provided. The output signal can be converted to a digital output signal $V_H$ by an analog-to-digital converter ("ADC") 208 in a microcontroller 206 having power terminals $V_{DD}$ and $V_{SS}$ coupled between $V_C$ and ground. If the Hall element 202, the operational amplifier 204, and the ADC 208 or the ADC 208 and the microcontroller 206 are coupled together in a package, a buffered Hall sensor with a digital output is provided.

Figure 3A:
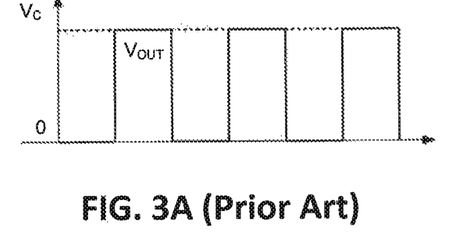
FIG. 3A is a timing diagram for an additional Hall sensor circuit with a digital output including additional processing circuitry according to the prior art.
Figure 3B:
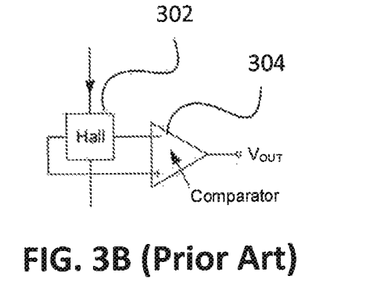
FIG. 3B is a schematic diagram of the sensor circuit for generating the signal shown in the timing diagram of FIG. 2A according to the prior art.

FIG. 3A is a timing diagram for a buffered Hall sensor circuit having a digital output including additional processing circuitry according to the prior art and FIG. 3B is a schematic diagram of the buffered Hall sensor circuit having a digital output for generating the signal shown in the timing diagram of FIG. 3A according to the prior art. In FIG. 3B, a Hall element 302 is coupled between $V_C$ and ground, and generates a differential output. The differential output of the Hall element 302 is coupled to a comparator 304 having positive and negative inputs and an output for generating the $V_{OUT}$ digital output signal. If Hall element 302 and comparator 304 are coupled together in a package, a buffered Hall sensor with a digital output is provided.

While the buffered Hall sensor circuits shown in FIGS. 2B and 3B are acceptable for many sensing applications, they may be unacceptable for being implemented into the lowest cost applications and operating environments due to the cost of the additional signal processing circuitry into the package with the Hall element.

SUMMARY

In accordance with an embodiment of the present invention, a Hall sensor circuit comprises a first Hall element having a first power node coupled to a first power source, a second power node coupled to a second power source, a first output node, and a second output node; a second Hall element having a first power node coupled to the first power source, a second power node coupled to the second power source, a first output node, and a second output node; first and second Analog-to-Digital Converter ("ADC") channel inputs passively and respectively coupled to the first and second output nodes of the first Hall element; third and fourth ADC channel inputs passively and respectively coupled to the first and second output nodes of the second Hall element; a first ADC output in communication with the first and second ADC channel inputs for providing a first digital output signal; and a second ADC output in communication with the third and fourth ADC channel inputs for providing a second digital output signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 4A:
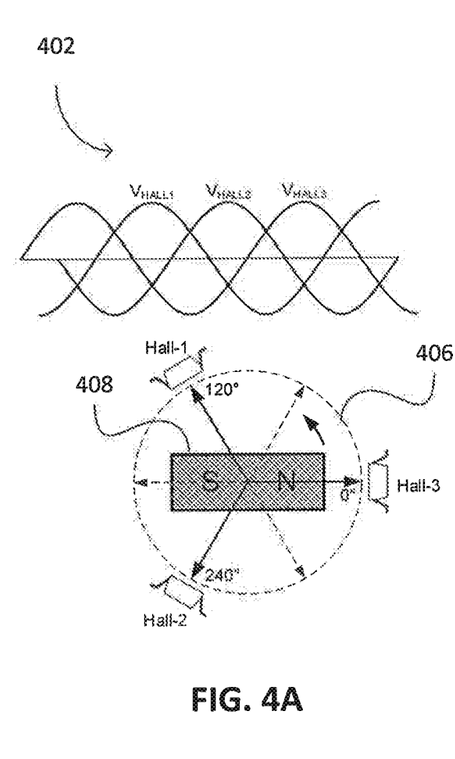
FIG. 4A is a schematic diagram of three Hall elements affixed to the stator of a motor for generating rotor position output signals without additional processing circuitry according to an embodiment.

FIG. 4A is a schematic diagram of three Hall elements affixed to the stator of a motor for generating rotor position output signals without additional processing circuitry according to an embodiment. Although additional processing circuitry such as an ADC is described herein to provide a complete sensor circuit, such additional processing circuitry is not included in the packaged Hall elements shown in FIG. 4A. For example, in certain applications, the Hall elements described herein will be affixed to a motor in a physical location that can be remote from, but in communication with the additional processing circuitry. The Hall elements may be packaged into a semiconductor package without additional processing circuitry, in an embodiment.

Permanent magnet motor control requires information regarding the rotor position of the motor so that the controller can output voltage on the correct angle in order for the motor to run properly. A Hall element can be used in a position sensing circuit and method as will be described in further detail below. In FIG. 4A the stator 404 and rotor 406 are shown. The stator is substantially circular in embodiments. Hall elements Hall-1, Hall-2, and Hall-3 are affixed to the stator 404 by being embedded in the stator 404 or affixed thereto in order to detect the changing magnetic flux generated by the rotating rotor 406. While Hall elements Hall-1, Hall-2, and Hall-3 are shown as packaged devices, it should be noted that the package only contains the basic Hall element and does not include a corresponding comparator, operational amplifier, or any other active signal processing circuitry, thus reducing costs. The Hall elements Hall-1, Hall-2, and Hall-3 are spaced apart at an angle of 120 degrees, with Hall element Hall-1 at 120 degrees, Hall element Hall-2 at 240 degrees, and Hall element Hall-3 at zero degrees. The corresponding output signals 402 from one of the Hall element outputs is also shown in FIG. 4A including signals $V_{HALL1}$, $V_{HALL2}$, and $V_{HALL3}$.

Figure 4B:
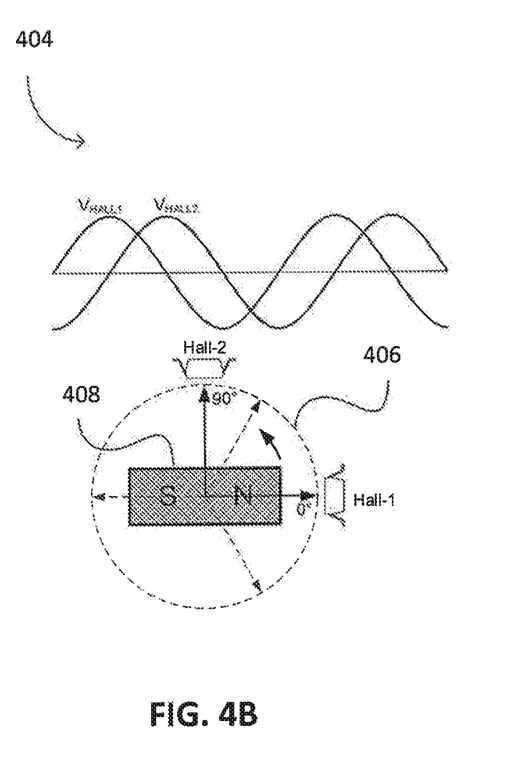
FIG. 4B is a schematic diagram of two Hall elements affixed to the stator of a motor for generating rotor position output signals without additional processing circuitry according to an embodiment.

FIG. 4B is a schematic diagram of two Hall elements affixed to the stator of a motor for generating rotor position output signals without additional processing circuitry according to an embodiment. In FIG. 4B the stator 404 and rotor 406 are also shown. The stator is substantially circular in embodiments. Hall elements Hall-1 and Hall-2 are affixed to the stator 404 by being embedded in the stator 404 or affixed thereto in order to detect the changing magnetic flux generated by the rotating rotor 406. While Hall elements Hall-1 and Hall-2 are shown as packaged devices, it should be noted that the package only contains the basic Hall element and does not include a corresponding comparator, operational amplifier, or any other active signal processing circuitry, thus reducing costs. The Hall elements Hall-1 and Hall-2 are spaced apart at an angle of 90 degrees, with Hall element Hall-1 at zero degrees, and Hall element Hall-2 at 90 degrees. The corresponding output signals 404 from one of the Hall element outputs is also shown in FIG. 4B including signals $V_{HALL1}$ and $V_{HALL2}$.

While three Hall elements are shown in a particular configuration in FIG. 4A, and two Hall elements are shown in a particular configuration in FIG. 4B, it will be appreciated by those skilled in the art that other numbers of Hall elements can be used in various configurations. For example, four Hall elements could be affixed to the stator with an angle spacing of ninety degrees between the Hall elements if desired, although one to three Hall elements will be typically used in embodiments.

Figure 5A:
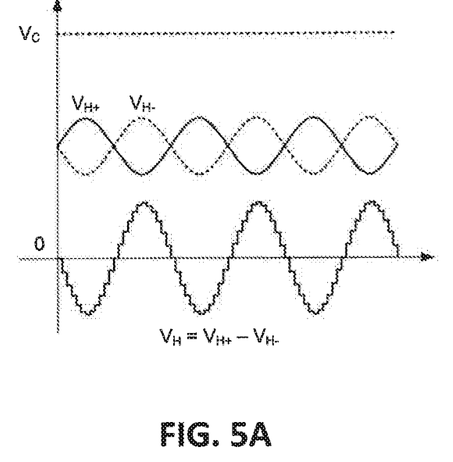
FIG. 5A is a timing diagram for a Hall sensor circuit according to an embodiment.
Figure 5B:
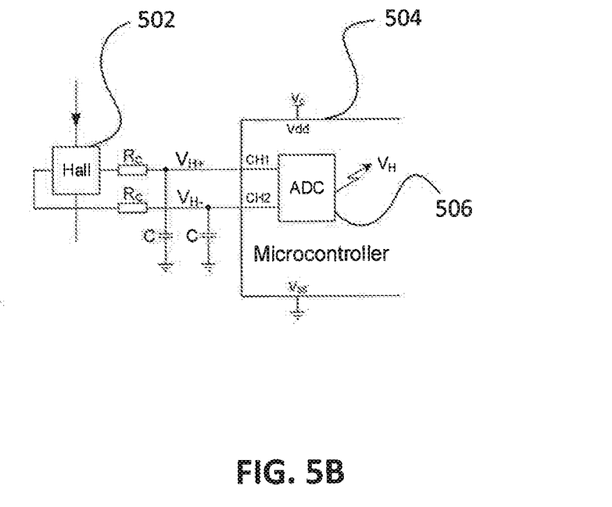
FIG. 5B is a schematic diagram of the sensor circuit for generating the signals shown in the timing diagram of FIG. 5A according to an embodiment.

FIG. 5A is a timing diagram for a Hall sensor circuit according to an embodiment and FIG. 5B is a schematic diagram of the sensor circuit for generating the signals shown in the timing diagram of FIG. 5A according to an embodiment. According to embodiments, a sensor circuit and method are described using Hall elements packaged without adding active components such as an analog comparator or operational amplifier as signal conditioning circuits. As previously described, there are two output signals on a Hall element labeled $V_{H+}$ and $V_{H-}$ in FIGS. 5A and 5B. The two output signals are passively coupled to two ADC input channels CH1 and CH2. The coupling can be direct, or indirect through a passive resistor-capacitor filter (RC filter) comprising resistors $R_C$ and capacitors C as shown in FIG. 5B. While no active processing circuitry is used to couple the outputs of the Hall element 502 to the input channels CH1 and CH2 of ADC 506, Hall element 502 can be selected to have sufficient voltage output to be properly sensed by ADC 506. For example, Hall elements 502 are available that have an output differential voltage in excess of 300 mV. ADC 506 can be part of a microcontroller 504. Microcontroller 504 has power supply terminals $V_{DD}$ and $V_{SS}$ coupled between the $V_C$ power supply and ground. Microcontroller ADC 506 samples and converts the two analog signals $V_{H+}$ and $V_{H-}$ individually. The results of two samples of signals $V_{H+}$ and $V_{H-}$ are subtracted by microcontroller 504 to generate the digital output signal $V_H = V_{H+} - V_{H-}$. Once the subtraction has been completed, the microcontroller 504 generates the output signal of Hall sensor. The two analog signals VH+ and VH− can be sampled simultaneously (if the design of ADC 506 allows for simultaneous sampling), or can be sampled serially (if the design of ADC 506 does not allow for simultaneous sampling). At most slow rotor speeds (described in further detail below) the sampling delay time between samples is not significant to the accuracy of determining the rotor position. FIG. 5A shows the waveforms for the $V_{H+}$, $V_{H-}$, and $V_H$ signals, as well as the $V_C$ power supply voltage and ground levels. FIG. 5B shows the sensor circuit including the Hall element 502, the passive RC filter ($R_C$, C), and the microcontroller 504 including ADC 506 previously discussed.

Figure 6:
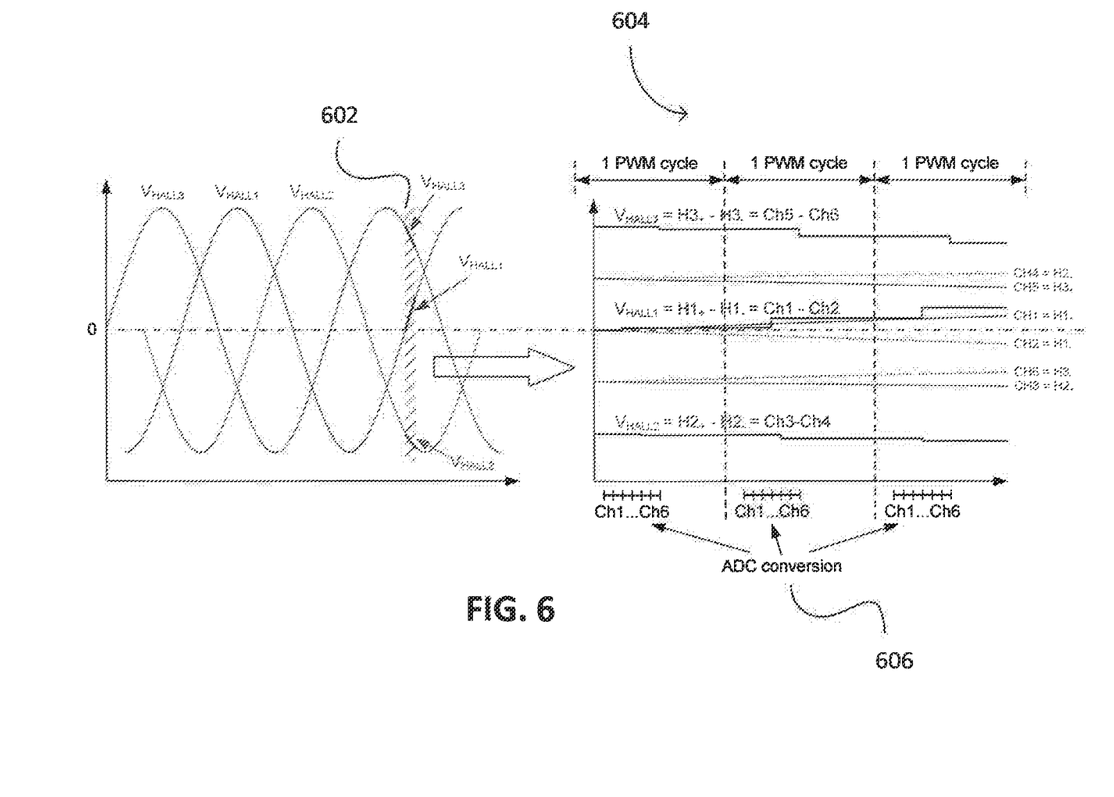
FIG. 6 is a timing diagram showing rotor position output signals according to an embodiment.

FIG. 6 is a timing diagram showing rotor position output signals according to an embodiment. The left portion of FIG. 6 shows the $V_{HALL1}$, $V_{HALL2}$, and $V_{HALL3}$ signals using a first time base including a narrow time slice 602. The right portion of FIG. 6 shows time slice 602 with a second expanded time base to show the $V_{HALL1}$, $V_{HALL2}$, and $V_{HALL3}$ signals. As is shown in further detail in FIGS. 7 and 8, $V_{H3}$ is equal to $H_{3+}$–$H_{3-}$ on channels 5 and 6, $V_{H1}$ is equal to $H_{1+}$–$H_{1-}$ on channels 1 and 2, and $V_{H2}$ is equal to $H_{2+}$–$H_{2-}$ on channels 3 and 4. Three serial ADC conversions 606 in three successive Pulse Width Modulation ("PWM") cycles of all six channels are shown on the X-axis of the right portion of FIG. 6.

Figure 7:
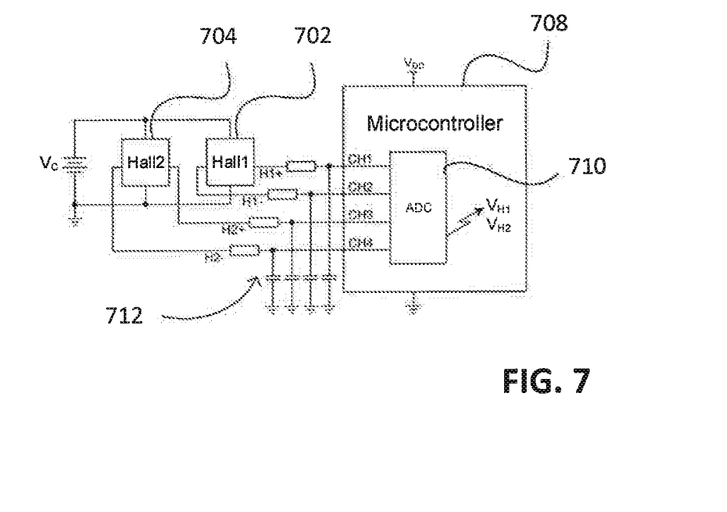
FIG. 7 is a schematic diagram of a two Hall element sensor circuit and microcontroller according to an embodiment.

In a motor control system, the number of Hall elements can vary from one to three (or more) in different implementations and embodiments. Each Hall element can be passively coupled to the ADC as is shown in FIG. 7 (two Hall elements) and FIG. 8 (three Hall elements). No analog comparator or operational amplifier is needed, thus lowering costs and allowing for profitable implementation in lower cost motor control applications. Simple passive RC filtering may be required in order to filter out noise from other parts of the motor control system.

FIG. 7 is a schematic diagram of a two Hall element sensor circuit and microcontroller according to an embodiment. Hall elements 702 and 704 are powered by $V_C$ and ground. The differential output signal $H_{1+}$ and $H_{1-}$ of Hall element 702 is passively coupled to channels 1 and 2 of ADC 710 in microcontroller 708 through passive RC filter 712, although a direct coupling could be used in embodiments. The differential output signal $H_{2+}$ and $H_{2-}$ of Hall element 704 is passively coupled to channels 3 and 4 of ADC 710 in microcontroller 708 through passive RC filter 712, although a direct coupling could be used in embodiments. ADC, in turn, generates digital signals $V_{H1}$ and $V_{H2}$. While a single ADC 710 is shown in FIG. 7, it will be appreciated by those skilled in the art that two or more ADCs could be used in an embodiment.

Figure 8:
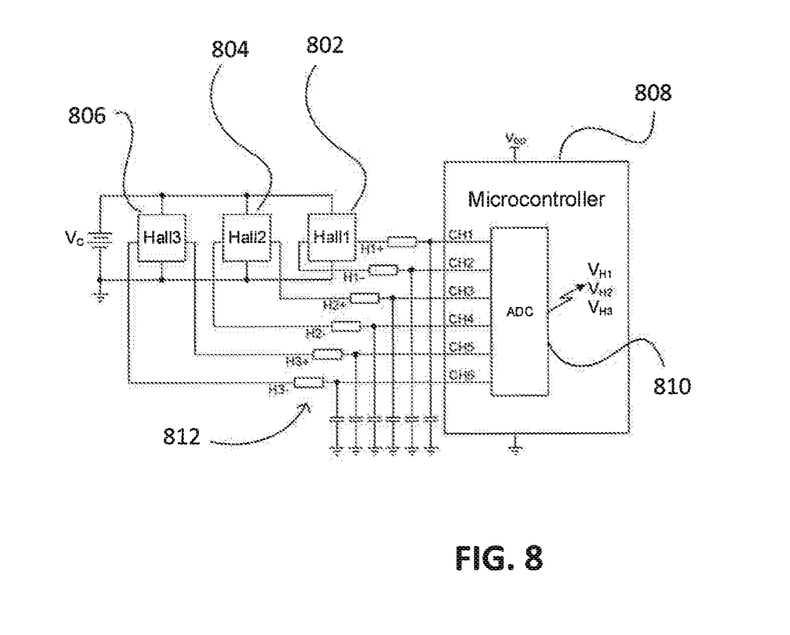
FIG. 8 is a schematic diagram of a three Hall element sensor circuit and microcontroller according to an embodiment.

FIG. 8 is a schematic diagram of a three Hall element sensor circuit and microcontroller according to an embodiment. Hall elements 802, 804, and 806 are powered by $V_C$ and ground. The differential output signal $H_{1+}$ and $H_{1-}$ of Hall element 802 is passively coupled to channels 1 and 2 of ADC 810 in microcontroller 808 through passive RC filter 812, although a direct coupling could be used in embodiments. The differential output signal $H_{2+}$ and $H_{2-}$ of Hall element 804 is passively coupled to channels 3 and 4 of ADC 810 in microcontroller 808 through passive RC filter 812, although a direct coupling could be used in embodiments. The differential output signal $H_{3+}$ and $H_{3-}$ of Hall element 806 is passively coupled to channels 5 and 6 of ADC 810 in microcontroller 808 through passive RC filter 812, although a direct coupling could be used in embodiments. ADC, in turn, generates digital signals $V_{H1}$, $V_{H2}$, and $V_{H3}$. While a single ADC 810 is shown in FIG. 8, it will be appreciated by those skilled in the art that two, three, or more ADCs could be used in an embodiment.

A motor control system for a Brush-Less DC motor ("BLDC" motor) or Permanent Magnet Synchronous Motor ("PMSM") is described below. Angle information of the magnet flux created by permanent magnet poles inside the motor (rotor angle) is needed to control the motor efficiently. In an embodiment, the motor control system comprises Hall effect sensors in combination with current sensors.

Figure 9:
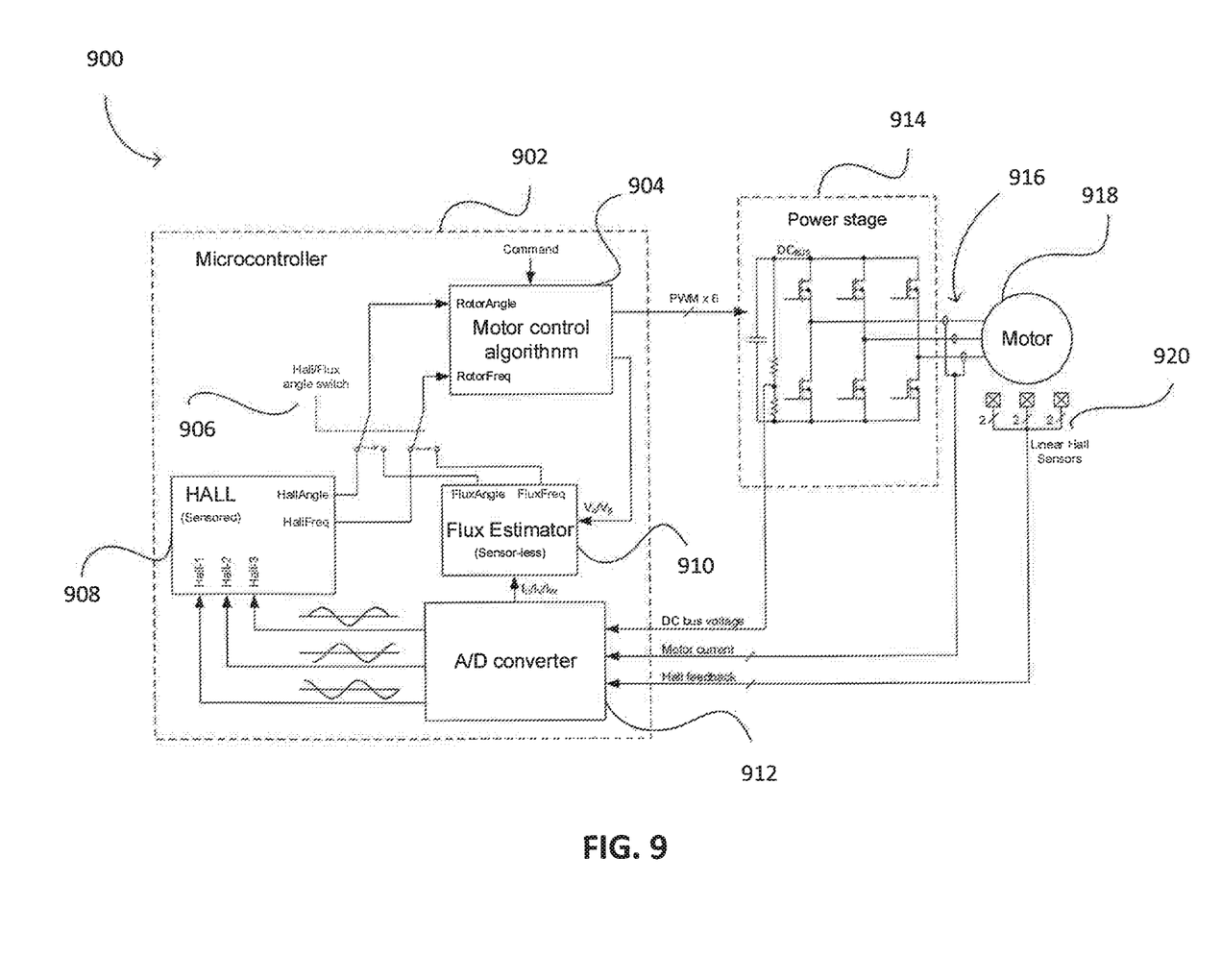
FIG. 9 is a schematic and block diagram of a motor control system according to an embodiment.

FIG. 9 is a schematic and block diagram of a motor control system 900 according to an embodiment. Microcontroller 902 includes a motor control algorithm block 904, a Hall/Flux angle switch 906, a Hall software block 908, a flux estimator 910, and an ADC 912. The microcontroller controls a power stage 914 with a PWM signal on a PWM bus. The power stage 914 is coupled to a motor 918 through three output currents, which are measured by a current sensor 916. Hall elements 920 measure the rotor position of motor 918 as was previously discussed.

The schematic and block diagram of FIG. 9 shows motor control system 900 using Hall elements 920 and a Hall software block 908 that generates the rotor angle (HallAngle) and rotor frequency (HallFreq) from Hall inputs Hall-1, Hall-2, and Hall-3 which were sampled by ADC converter 912 on the Hall feedback bus as shown. The schematic and block diagram of FIG. 9 also shows an optional software module 910 (Flux estimator) that estimates the rotor angle (FluxAngle) and rotor frequency (FluxFreq) by using motor currents (Iu/Iv/Iw) and voltages applied to motor (Vα/Vβ). Motor control software block 904 starts the motor 918 using angle and frequency information from Hall software block 908 (HallAngle/HallFreq). When the motor accelerates to a predetermined rotational speed/frequency, angle switch 906 may switch to couple the FluxAngle and FluxFreq information to motor control algorithm block 904. The switch over rotational speed (frequency) can be configurable by the microcontroller 902. The predetermined rotational speed for transferring control of the motor 918 from the Hall elements 920 to the current sensor 916 will depend upon the particular motor used. In general, however, lower operational speeds will be controlled by the Hall element angle and frequency information and higher operational speeds will be controlled by the flux angle and frequency information (which is not derived from the Hall elements, but is derived from the current sensor 916 information).

The ADC 912 can comprise a single ADC or multiple ADCs. The inputs to ADC 912 include the DC bus voltage from power stage 814, the motor current bus from current sensor 816, and the Hall feedback bus from the Hall elements 920. ADC 912 is shown as providing three output signals that correspond to the rotor position of the rotor in motor 918.

For unbuffered Hall elements, which as previously discussed provide an analog output, the ADC 912 output provides a corresponding digital value having a digital value range from –2048 to +2047 (in the case of a 12-bit ADC, the raw output is typically unsigned at a value range of zero to 4095, and then usually converted to a signed value range of –2048 to +2047 if the zero signal input of the unbuffered Hall element is centered in the middle of the ADC input range).

Hall software block 908 includes Hall-1, Hall-2, and Hall-3 inputs and HallAngle and HallFreq outputs as previously discussed. The HallAngle and HallFreq outputs are coupled to a first input of Hall/Flux angle switch 906. Flux Estimator 910 uses the motor currents (Iu/Iv/Iw) and voltage information (Vα/Vβ) to generate the FluxAngle and FluxFreq outputs, which are coupled to a second input of the Hall/Flux angle switch 906. The outputs of the Hall/Flux angle switch 906 are under the control of a microcontroller input that is controlled by the rotational frequency of motor 918 as previously discussed. The outputs of switch 906 are coupled to the RotorAngle and RotorFreq inputs. A command signal is received by the motor control algorithm block to generate the PWM signal motor operation is required.

Various algorithms can be used in blocks 904, 908, and 910. Aspects of particular algorithms according to embodiments are described below, but others can be implemented as well.

The Hall software block 908 can comprise a functional block to generate rotor angle and rotor frequency (HallAngle and HallFreq) from the Hall inputs. Depending on the design, the number of Hall elements can vary from one to three as previously discussed. Different known equations can be used to convert the Hall element signal into the HallAngle value, which represents the electrical angle of magnet poles that is sensed by the Hall elements. HallFreq represents the rotating speed of the magnet poles, and can be derived from the difference of the HallAngle value of the current computation cycle and the HallAngle value of the previous computation cycle. HallAngle can be directly converted from the present sensed Hall element signal. Due to the nonlinearity of the Hall element, offset of the Hall element placement, characteristic of the magnet pole or location of the Hall element related to magnet poles, the linearity of the direct HallAngle value may not be precise enough for certain applications. For example, excessive motor noise or vibration could occur in some instances. Additional processing can be used to generate a smoother HallAngle, which helps reduce motor noise and vibration. For example, a time difference between two occurrences of the same angle can be calculated, and this time information in turn can be used to generate an actual HallAngle output by a linear increment. To further smooth out the HallAngle, a time difference between two occurrences of same angle can be filtered by a low pass filter.

The flux estimator 910 can comprise a functional block to generate rotor angle and rotor frequency (FluxAngle and FluxFreq in block 910) without the Hall element signal. In this functional block, FluxAngle and FluxFreq are calculated based on motor current and motor voltage information. In order for the flux estimator to work correctly, motor back-Electromotive Force ("EMF") information must be present. Motor back-EMF information is proportional to motor speed. There is no back-EMF if the motor is not moving, or the back-EMF information is too low for proper motor control if the motor is spinning at very low speeds. Angle switch 906 is controlled by microcontroller 902 to feed rotor angle and rotor frequency information into motor control algorithm 904 with the best appropriate angle information, either from Hall software block 908 or the Flux Estimator block 910. In general, rotor angle and rotor frequency are from the Hall block 908 when the motor is not spinning or spinning at low speed. The angle and frequency from the Flux Estimator block 910 can be used when the motor speed is above certain threshold. The switch over speed may vary depends on motor specification and control board design. Typical switch over speed can be set between 3% to 10% of maximum motor speed because rotor angle from the flux estimator should already be stable with an appropriately designed motor control system. The switch over between the Hall angle/frequency and the flux angle/frequency can also be smoothed out in embodiments.

The motor control algorithm 904 can comprise a functional block to generate an on/off signal (PWM signal) for each switching device in power stage 914. There are many motor control algorithms that can be used to control a motor. The duty cycle and pattern of PWM signals are different at different motor angles or under different load conditions. The changes of duty cycle and pattern of PWM signals results in different voltages and currents applied to each motor phase. The calculation of PWM output duty cycle and pattern are based on RotorAngle and RotorFreq, which are the outputs of either Hall software block 908 or Flux Estimator block 910. Some control algorithms, for example, Field Oriented Control ("FOC" control) also need motor current information to regulate the current on each motor phase.

Power stage 914 can comprise a plurality of (for example, four or six) power devices in an embodiment for driving motor 918. Power stage 914 can also include a filter capacitor and a voltage divider for generating the DC bus voltage information.

Current sensor 916 can comprise a sense resistor or a separate current sense output associated with at least some of the power devices, in an embodiment. Other current sense circuits or devices are known in the art.

Motor 918 can comprise various AC electric motors particularly suited for low cost applications such as small appliances including fans and other household appliances.

While three Hall elements 920 are shown in FIG. 9, any number can be used as previously described.

In summary, only two ADC channels are necessary to passively sense (directly or through a passive filter) the signal of each Hall element output without the necessity of corresponding signal processing circuitry such as comparators or operational amplifiers. Particular embodiments and applications, such as motor control applications, using Hall elements and passive coupling to an ADC or ADCs have been described.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A Hall sensor circuit comprising:
a first Hall element having a first power node coupled to a first power source, a second power node coupled to a second power source, a first output node, and a second output node;
a second Hall element having a first power node coupled to the first power source, a second power node coupled to the second power source, a first output node, and a second output node;
first and second Analog-to-Digital Converter ("ADC") channel inputs passively and respectively coupled to the first and second output nodes of the first Hall element;
third and fourth ADC channel inputs passively and respectively coupled to the first and second output nodes of the second Hall element;
a first ADC output in communication with the first and second ADC channel inputs for providing a first digital output signal;
a second ADC output in communication with the third and fourth ADC channel inputs for providing a second digital output signal;
a first filter for coupling the first and second ADC channel inputs to the first and second output nodes of the first Hall element; and
a second filter for coupling the third and fourth ADC channel inputs to the first and second output nodes of the second Hall element.
2. The Hall sensor circuit of claim 1, further comprising:
a third Hall element having a first power node coupled to the first power source, a second power node coupled to the second power source, a first output node, and a second output node;
fifth and sixth ADC channel inputs passively and respectively coupled to the first and second output nodes of the third Hall element; and a third ADC output in communication with the fifth and sixth ADC channel inputs for providing a third digital output signal.

3. The Hall sensor circuit of claim 1, wherein the first and second filters each comprise a resistor-capacitor low pass filter.

4. The Hall sensor circuit of claim 1, wherein the first, second, third and fourth ADC channel inputs and the first and second ADC outputs comprise a single ADC.

5. The Hall sensor circuit of claim 1, wherein the first and second ADC channel inputs and the first ADC output comprise a first ADC, and wherein the third and fourth ADC channel inputs and the second ADC output comprise a second ADC.

6. The Hall sensor circuit of claim 1, wherein the first and second Hall elements are attached to a stator of a motor.

7. The Hall sensor circuit of claim 6, wherein the stator is substantially circular, and an angle between the first and second Hall elements is about ninety degrees.

8. The Hall sensor circuit of claim 2, wherein the first, second, and third Hall elements are attached to a stator of a motor.

9. The Hall sensor circuit of claim 8, wherein the stator is substantially circular, and an angle between the first, second, and third Hall elements is about one hundred and twenty degrees.

10. A motor control system comprising:
a plurality of Hall elements for sensing a position of a rotor in a motor;
an Analog-to-Digital Converter ("ADC") having a plurality of inputs that are passively coupled to an output of each of the plurality of Hall elements;
a first angle and frequency generator having a plurality of inputs coupled to a plurality of outputs of the ADC;
a Pulse-Width Modulation ("PWM") controller having a plurality of inputs coupled to a plurality of outputs of the first angle and frequency generator;
a power stage comprising a plurality of power devices having an input coupled to an output of the PWM controller;
a plurality of filters coupled between the plurality of Hall elements and the ADC, wherein the plurality of filters each comprise a resistor-capacitor low pass filter;
a current sensor configured for sensing output currents of the power stage;
a second angle and frequency generator having a plurality of outputs; and
a switch having a first input coupled to the first angle and frequency generator, a second input coupled to the second angle and frequency generator, and an output coupled to the PWM controller,
wherein the ADC comprises a plurality of inputs coupled to the current sensor and a plurality of outputs coupled to the second angle and frequency generator.

11. The motor control system of claim 10, wherein a switch is configured to couple the first angle and frequency generator to the PWM controller in a low frequency mode of operation, and configured to couple the second angle and frequency generator to the PWM controller in a high frequency mode of operation.

12. The motor control system of claim 10, further comprising a motor having a stator including three embedded Hall elements spaced apart by about one hundred and twenty degrees.

* * * * *